United States Patent [19]

Appold

[11] Patent Number: 5,481,203

[45] Date of Patent: Jan. 2, 1996

[54] ADAPTER FOR QUAD FLAT PACK FAILURE-ANALYSIS SOCKET

[75] Inventor: Brian M. Appold, Fremont, Calif.

[73] Assignee: VLSI Technology, Inc., San Jose, Calif.

[21] Appl. No.: 286,563

[22] Filed: Aug. 5, 1994

[51] Int. Cl.$^6$ ........................................... G01R 1/06
[52] U.S. Cl. ........................................... 324/755; 439/654
[58] Field of Search .................. 439/70, 68, 654; 324/537, 755

[56] References Cited

U.S. PATENT DOCUMENTS

| | | | |
|---|---|---|---|
| 4,618,196 | 10/1986 | Muzslay | 439/654 |
| 4,862,076 | 8/1989 | Renner | 439/68 |
| 5,159,266 | 10/1992 | Appold | 324/537 |
| 5,281,151 | 1/1994 | Arima | 439/68 |

*Primary Examiner*—Kenneth A. Wieder
*Assistant Examiner*—Mark Wardas
*Attorney, Agent, or Firm*—Patrick T. King

[57] ABSTRACT

A test socket assembly includes a test and failure-analysis socket and an adapter board. Only the top interior surfaces of a QFP package mounted in the test socket are available for testing and probing. The socket must then be used for testing and analyzing only QFP integrated-circuit packages where the die is available for access from the top of the test socket. QFP integrated-circuit packages with a cavity-down configuration which were mounted upside-down in the test socket would have its lead connections to the test socket "scrambled" and would not match the input-pin pattern of the automatic test equipment. The adapter board to "unscramble" the connections between the tester and the test socket with a cavity-down QFP device, which is mounted upside down in the test socket, allowing the test socket to be used with a cavity-down device. In one preferred embodiment, the adapter is a PCB which takes the pins of the socket with an upside down, cavity down part in it and "descrambles" the pins to make it compatible with the input-pin pattern of the automatic test equipment which is testing a right-side up, cavity-down device. With this adapter, cavity-down devices can be used with the test socket with no changes to existing testing hardware or software.

8 Claims, 5 Drawing Sheets

ADAPTER FOR QUAD FLAT PACK FAILURE-ANALYSIS SOCKET

BACKGROUND OF THE INVENTION

1. Field of the Invention

This invention relates to apparatus and methods for testing packaged integrated circuits and, more particularly, to test sockets and methods for failure analysis of cavity-down or "dead bug" quad flat pack (QFP) integrated circuit devices.

2. Prior Art

Integrated circuits are commonly packaged in a package configuration referred to as a QFP package. In this type of package, the leads are very thin, flat metal conductors which extend outwardly from the four side walls of the flat rectangular package. Inoperative QFP devices are frequently returned by customers to the manufacturer as allegedly defective parts for further testing and failure analysis by the manufacturer. These returned QFP devices are often returned with damaged leads because the customers have performed incoming inspection and in-situ testing of these devices with the devices having been mounted to the actual circuit boards of a system. For testing, the individual integrated-circuit devices are soldered to a circuit board and the entire circuit board is tested by the customer. When a particular integrated-circuit device is suspected of being defective, that device is removed from the circuit board by desoldering. During this de-soldering step, the leads of the device are often severely damaged. This kind of damage to the leads often prevents the integrated-circuit device from being tested on the manufacturer's automatic test equipment in order to verify that the device itself was defective, rather than damaged or misused by the customer. Customers return defective devices to the manufacturers and request credit, so that it is imperative to the manufacturer that the returned devices be retested and analyzed to properly assess the cause of the defect in a device. Because of the damage to the leads on these devices, manufacturers of these returned devices are often unable to perform the necessary testing and failure analysis work to verify the cause of the failure. In addition, other questions about the devices cannot be investigated and answered, questions such as how, where, and why the device failed. Finally, as a result of the damage to the leads of these devices, the most significant aspect of failure analysis cannot be performed, that is, determining the root cause of the failure and requesting corrective action from the responsible areas of the manufacturer or customer.

One prior art technique for dealing with damaged QFP leads is to manually solder a test-lead wire to the damaged very thin lead to obtain electrical contact with the lead. This is difficult to do with packages having greater than 100 leads. A historically poor success rate for manually soldering a test-lead wire to damaged leads indicates that a better, more efficient technique is needed to allow the retesting of damaged QFP devices on a manufacturer's automatic test equipment.

Another prior art technique is disclosed in U.S. Pat. No. 5,159,266, granted Oct. 27, 1992, to Brian M. Appold for 'Test Socket and Method for Failure Analysis of Plastic Quad Flat Pack Devices." This patent discloses a test socket and method for mounting and testing a quad flat pack QFP integrated-circuit package, where the QFP package has its leads cut flush or extending a predetermined distance from the sidewalls of the QFP integrated-circuit package. The test socket includes a base to which are resiliently mounted a number of contact blades having contacts for contacting the cut leads of the QFP device. A number of tester connection pins are mounted in the base and are connected to the contact blades.

The arrangement described in the Appold 266 patent works only with "cavity-up" QFP packages in which the integrated-circuit die is mounted upright in the package. The socket permits the top of the package and the surface of the die to be exposed for probing. In a cavity-down configuration, the surface of the die is not accessible for probing.

A recent trend in the semiconductor integrated-circuit industry is to utilize a technique for mounting integrated-circuit dies called "cavity down" or "dead bug", where the cavity containing the die faces downward. This technique is gaining popularity because of the improved thermal performance that is achieved through the use of the cavity down technique. With the continued reduction in the geometry's of today's silicon technologies, increased numbers of transistors per unit area result in silicon dies which have increased thermal dissipation requirements. In an effort to meet these requirements, cavity-down packaging is being exploited. In a cavity down package, the lead frame is turned upside down relative to the external package leads. The silicon die, which is attached to the lead frame paddle, is thus also upside down. This upside down configuration improves the thermal characteristics of the packaged device because the path for heat dissipation is through the lead frame paddle and surrounding plastic encapsulation material. With the lead frame paddle near the top of the package, the thermal dissipation is maximized since the top of the package is exposed to the flow of surrounding air. This is in contrast to the cavity-up configuration in which the lead frame paddle is near the bottom of the package where there is little or no airflow. A cavity-down package also allows an end user the option of attaching a heat sink to the top of the package which additionally improves the thermal dissipation of the packaged device. A cavity-up package would gain little benefit from the attachment of a heat sink to the top of the package. For these reasons, the cavity-down packaging technique is being utilized.

A problem to be solved arises when one of these cavity-down packages is found to be defective. A failed device is submitted to a failure analysis group with a request that the failure mechanism be determined. The failure analysis inevitably requires that the silicon die in the package be exposed. Common failure analysis techniques such as liquid crystal, dynamic liquid crystal, emission microscopy, micro-probing, and e-beam probing require that the device under test (DUT) have power applied to it. Current analysis techniques for liquid crystal and emission microscopy entail drilling a hole in the bottom of an off-the-shelf socket and attaching a specifically designed printed circuit board (PCB) to the socket in order to provide electrical access to the package pins. This type of hardware is large and expensive and is useful only when the QFP package leads are in perfect condition and the lab analysis equipment is fitted with expensive lenses suitable for long working distances. QFP devices submitted to the failure analysis groups rarely have leads in perfect condition. The limited area which can be drilled out from the bottom of an off-the-shelf QFP socket, restricts this technique to use with small dies. There are no failure analysis procedures for using dynamic liquid crystal, micro-probing or e-beam probing techniques with cavity-down packages.

Consequently, the need exists for a technique for testing and performing failure analysis of damaged QFP integrated-devices which have a cavity-down configuration.

SUMMARY OF THE INVENTION

It is therefore an object of the invention to provide a technique for testing and performing failure analysis of cavity-down QFP integrated-devices.

In accordance with these and other objects of the invention, the invention provides a test socket assembly which includes a test socket and an adapter board. Because the output pins of the test socket mate with input sockets, provided by automatic equipment, access cannot be made to the bottom of the QFP package. When the top layer of packaging material is removed from the QFP package in order to expose the die surface, only the top interior surfaces of the QFP package are available for testing and probing. The test and failure analysis socket must then be used for testing and analyzing only QFP integrated-circuit packages where the die is available for access from the top of the test socket, i.e., cavity up. QFP integrated-circuit packages with a cavity-down configuration would ordinarily not be able to be tested in the test and failure-analysis socket because a cavity-down QFP package, which is mounted upside-down in the test socket, would have its lead connections to the test socket "scrambled" and would not match the pin pattern of the test machine.

Using the adapter board to "unscramble" the connections between the tester and the test socket with a cavity-down QFP device, which is mounted upside down in the test socket, allows the socket to be used with a cavity-down device. As was mentioned above, cavity-down or "dead bug" means that the die is mounted upside down in the package. In order to expose the die for failure analysis work, the package itself must be turned upside down. When this happens, pin 1 on the test socket no longer corresponds to pin 1 on the QFP device. The desirable features of the socket can now be used to test and analyze cavity-down QFP devices with the use of the proposed adapter. The invention provides a solution for working with dynamic liquid crystal, micro-probing, and e-beam probing techniques on cavity down device. In one preferred err, bodiment, the adapter is a PCB that would take the pins of the socket with an upside down, cavity down part in it and "de-scramble" the pins to make it compatible with a right-side up, cavity-down device. With this adapter, cavity-down devices could be used with the socket with no changes to existing testing hardware or software, thereby, avoiding additional costly hardware and/ or software changes.

The test socket assembly for mounting and testing a cavity-down quad flat pack QFP integrated-circuit device having a plurality of leads, which are cut off flush to the sidewalls of said QFP package, includes a test socket having a base on which is mounted and supported a cavity-down QFP integrated-circuit package with the package being mounted with the die up so that the die is positioned at the top of the test socket for probing and analysis. The test socket has a plurality of resilient contact blades mounted to the base for engagement with a corresponding flush cutoff lead of the QFP package. The test socket includes a plurality of test connection pins mounted in said base and connected to respective ones of said contact blades. Means are provided for unscrambling the connections between the external pins of the test socket and the test inputs sockets of the automatic test equipment so that a cavity-down QFP mounted upside-down can be tested in the same test socket as a cavity-up QFP device.

The means for unscrambling includes an adapter member for making connections between correspondingly numbered pins of the test socket and input sockets of the automatic test equipment. In one preferred embodiment of the invention the adapter member is formed as a multi-layer printed-circuit board. The multi-layer printed-circuit board includes a top surface which has fixed thereto a number of adapter sockets for engagement with respective ones of the plurality of test connections pins mounted in the base. The adapter has a bottom surface which has a number of adapter test pins extending therefrom and which are adapted for engagement with input test sockets of a automatic test system for integrated-circuits. The test sockets are arranged in a predetermined pattern for making connections to a cavity-up QFP integrated-circuit package. To accommodate cavity-down QFP packages, the adapter has connection means for connecting adapter sockets to adapter test pins. The adapter test pins are arranged in a pattern for making connections to a cavity-up QFP integrated-circuit package when a cavity-down QFP package is mounted die-side-up in the test socket.

A method is provided according to the invention for mounting and for testing a cavity-down QFP integrated-circuit device having a plurality of leads, which are cut off flush to the sidewalls of a QFP package. The method includes the step of placing the cavity-down QFP integrated-circuit device in a test socket with the die of the cavity-down QFP integrated-circuit device in a cavity-up orientation. The test socket external output pins mounted to the test socket are arranged in a predetermined pattern for making connections between designated pins of a cavity-up QFP integrated-circuit package and correspondingly designated test input sockets of an automatic test machine. The method also includes the step of contacting the flush cutoff leads of the QFP integrated-circuit device with a respective one of a plurality of resiliently-mounted contact blades extending from said test socket to provide electrical contact with external pins mounted to said test socket. Finally, the method includes the step of unscrambling the connections between the external pins of the test socket and the test input sockets of the automatic test equipment so that a cavity-down QFP mounted upside-down can be tested in the same test socket as a cavity-up QFP device.

The step of unscrambling includes the steps of: designating each of the test input sockets of the automatic test equipment with respective specified pin numbers corresponding to the output pin numbers of a cavity-up QFP package; designating each of the output pins of the cavity-down QFP package with respective specified pin numbers; and providing respective electrical connection between each pair of respective pin numbers.

The step of providing respective electrical connections between each pair of respective pin numbers includes making such electrical connections with an adapter member having a top surface which has fixed thereto a number of adapter sockets for engagement with respective ones of the plurality of test connections pins mounted in the base. The adapter has a bottom surface having a number of adapter test pins extending therefrom and is adapted for engagement with a test socket of the automatic test equipment for integrated-circuits wherein said test sockets are arranged in a predetermined pattern for making connections to a cavity-up QFP integrated-circuit package. The adapter also has connection means for predeterminedly electrically connecting adapter sockets to adapter test pins in an arrangement which provides that the output pins of a cavity-down QFP package makes connections with the test sockets of the automatic test equipment. The test sockets are arranged in a pattern for making connections to a cavity-up QFP integrated-circuit package when a cavity-down QFP package is mounted die-side-up in the test socket to provide access to the die.

The step of providing electrical connections includes using an adapter member formed as a multi-layer printed-circuit board for unscrambling the connections between the external pins of the test socket and the test input sockets of the automatic test equipment so that a cavity-down QFP mounted upside-down can be tested in the same test socket as a cavity-up QFP device to provide access to the die.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
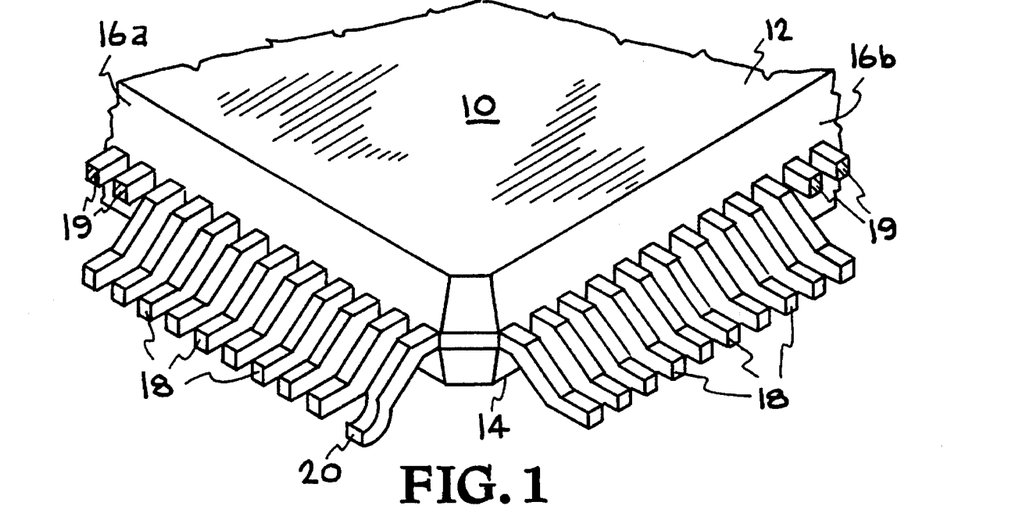
FIG. 1 is a partial view of a quad fiat pack QFP integrated circuit package having a bent lead as well as broken leads.

FIG. 1 shows a portion of a typical quad fiat pack (QFP) integrated circuit package 10, formed of molded epoxy material. The package has horizontal fiat top and bottom surfaces 12, 14 and vertical side walls (typically shown as 16a, 16b). A number of very thin metallic leads 18 have their distal portions extending horizontally outward from the side walls 16a, 16b of the package 10. The mid portion of the leads are directed downwardly at an angle, and the free ends of the leads are again directed horizontally outward from the package. For assembly and testing, an integrated-circuit package 10 is mounted by having the free ends of the leads 18 being soldered to pads on a printed circuit board. The integrated-circuit-die within the package can be either a cavity-up or a cavity-down configuration.

When a particular integrated-circuit is suspected of being defective, the package is removed from the printed circuit by de-soldering the leads. Often the leads are damaged during the process of desoldering and removing the device from the printed-circuit board. A lead 20 near the corner of the package 10 is shown with its free end bent, to represent a damaged lead. Leads 19 are shown as broken leads.

Figure 2:
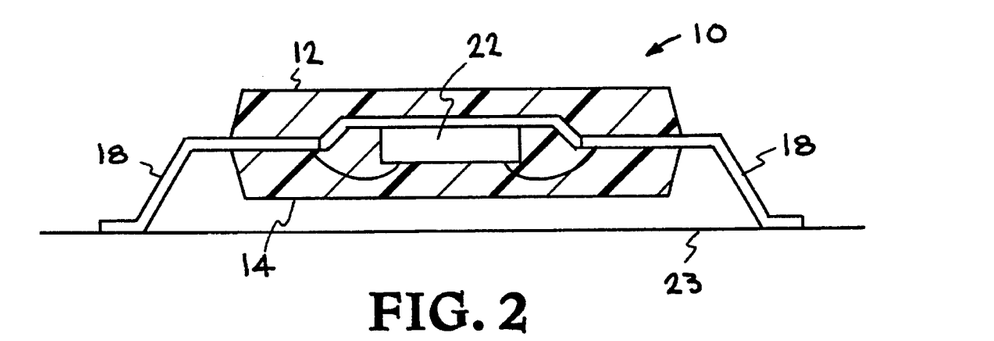
FIG. 2 is a sectional view of a cavity-down QFP package showing leads extending from an integrated circuit die and terminating in a coplanar seating reference plane.

FIG. 2 is a sectional view of a cavity-down QFP package 10 showing the leads 18 extending from a cavity-down integrated circuit die 22 within the package. The leads 18 terminate in a coplanar seating plane, represented by the line 23. Since this type of package is surface mounted to a print circuit board by tack-soldering the end of the leads 18 to pads on the circuit board, a lead end which is not located in the coplanar seating plane 23 may not be properly connected to the printed circuit board. Consequently, the end of a lead must meet a lead coplanarity specification with respect to an arbitrarily defined seating plane for a package, where the seating plane is defined as the plane of the three lowest lead ends of a package. The lead 20 shown in FIG. 1 would not meet the coplanarity specification. Because the leads 18 are very thin, they often break during the de-soldering step, as shown by leads 19. These breaks are often near the surface of the sidewalls 16a, 16b which makes it very difficult to connect the lead stub to an automatic test equipment for testing and analysis at the manufacturer's test site.

Figure 3:
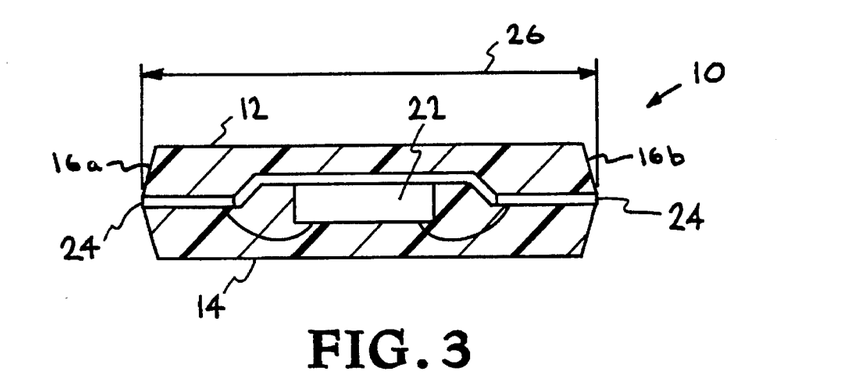
FIG. 3 is a sectional view of a cavity-down QFP package showing the leads trimmed to a predetermined length flush with the sidewalls of the package.

FIG. 3 is a sectional view of a cavity-down QFP package showing leads 24 trimmed to a predetermined length, for example, flush with the sidewalls 16a, 16b of the package 10. Note that other trimmed lead lengths can be used. Trimming the leads 24 of the package 10 flush with the sidewalls 16a, 16b provides for the typical case where a lead is broken at the sidewall. The leads 24 are trimmed flush by cutters or by grinding the leads away with an abrasive wheel or the like. The leads are cut, or trimmed, to provide a controlled distance 26 between the cut ends of the leads 24.

Figure 4A:
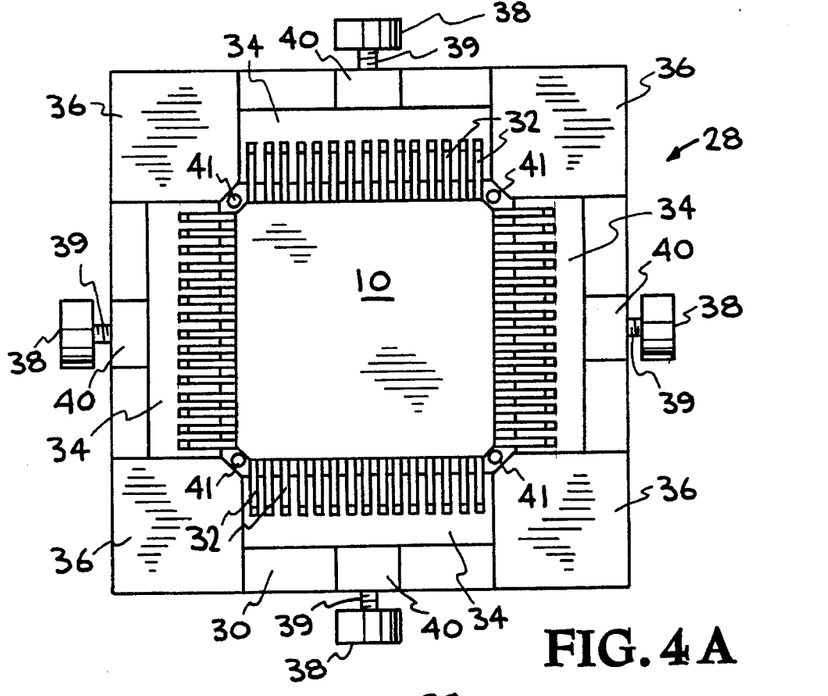
FIG. 4A is a top view of a test socket showing a number of test contact blades arrayed around the periphery of the socket for testing and analyzing a QFP device having its leads trimmed to a predetermined length.

FIG. 4A is a top view of a test socket 28 used in testing and analyzing either a cavity-up or a cavity-down QFP device with clipped leads. A test-socket base 30 is a rectangular-shaped plate formed of an electrical insulating material. A number of test contact blades 32 are formed of electrical conducting material. These contact blades 32 are positioned around the periphery of the test socket 28 to make contact with a QFP package which has clipped leads and which is positioned in the center area of the test socket 28.

Along each of the four sides of the test socket 28 are movable blade combs 34, which are blocks of insulating material having slots formed therein for keeping the contact blades 32 spaced apart from each other. At each of the four corners of the test-socket base are provided fixed guide blocks 36 which have side surfaces which engage with corresponding sides surfaces of the movable blade combs 34. Adjustment of the lateral position of each of the movable blade combs 34 is provided by means of an adjustment device, which includes a thumbscrew 38 having a shaft 39 with external threads formed therein for engagement with internal threads formed in a mounting block fixed to the center of each side of the base 30. Four positioning pins 41 are located on the base 30 to engage the chamfered corners of a QFP package 10.

Figure 4B:
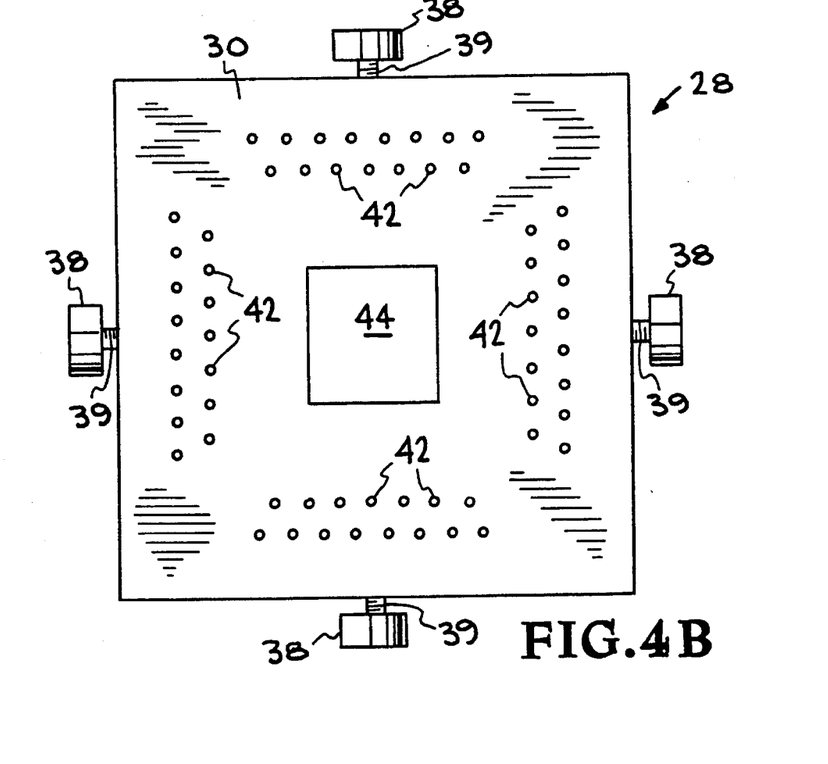
FIG. 4B is a bottom view of the test socket of FIG. 4, showing connection pins extending from the bottom of the test socket.

FIG. 4B is a bottom view of the test socket 28, showing a number of connection pins 42. Each of the contact blades 32 are respectively connected to connection pins 42 mounted in the base portion 30 of the socket and extend downwardly. For a cavity-up QFP package, the connection pins 42 are received in a test socket of the automatic test equipment in which the integrated circuit is tested and analyzed.

Figure 5:
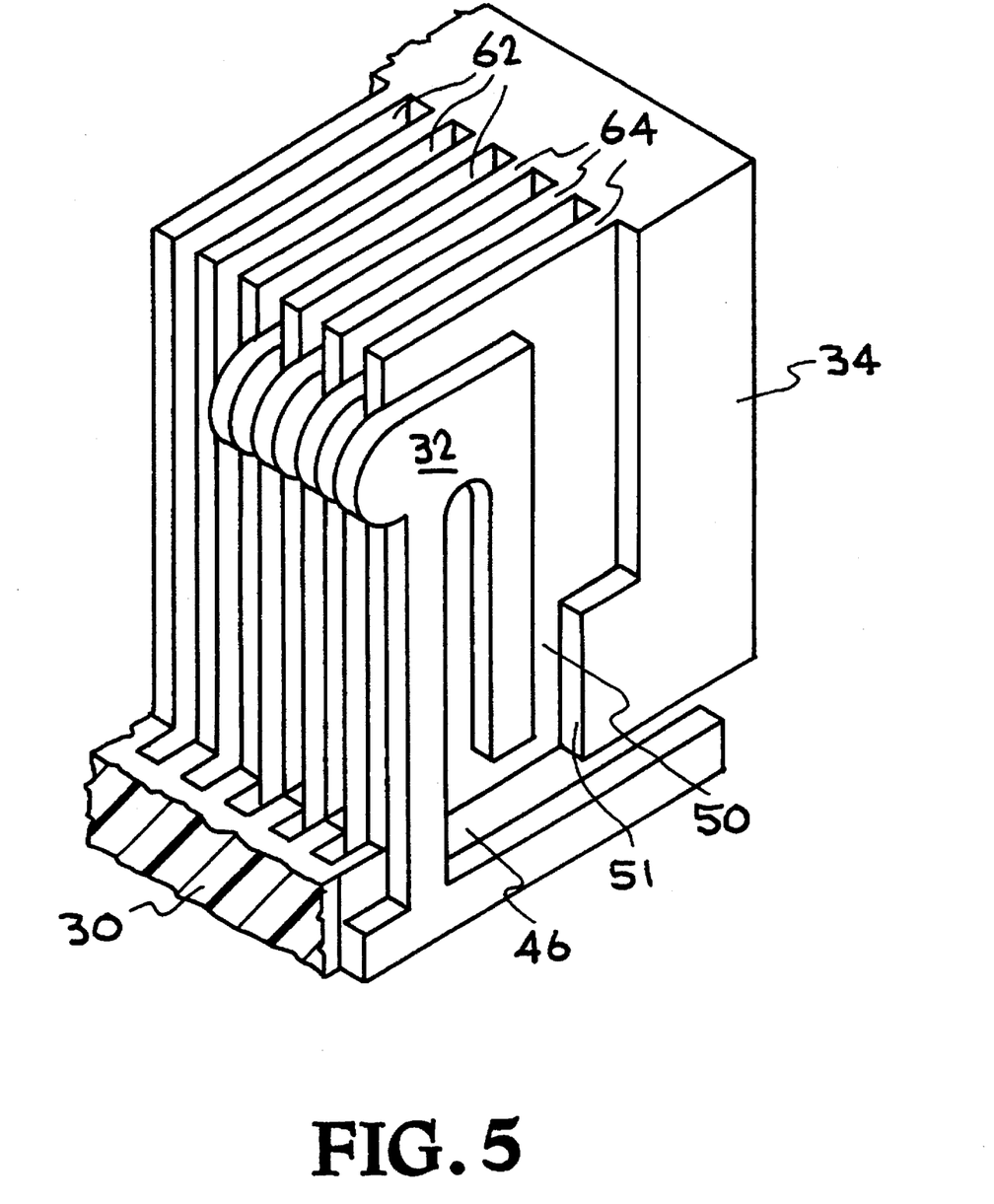
FIG. 5 is a partial view of a number of test contact blades spaced apart by the blades of an insulated comb member.

FIG. 5 is a partial isometric view, which shows in greater detail a number of test contact blades 32 fixed within a series of spaced-apart slots 62 formed in the comb 34. The blades 32 are spaced apart from each other by separator panels 64 extending from the comb 34. The gap 50 is provided between the free ends of the extension arms 32 and the inside surfaces 51 of the comb 34.

Figure 6:
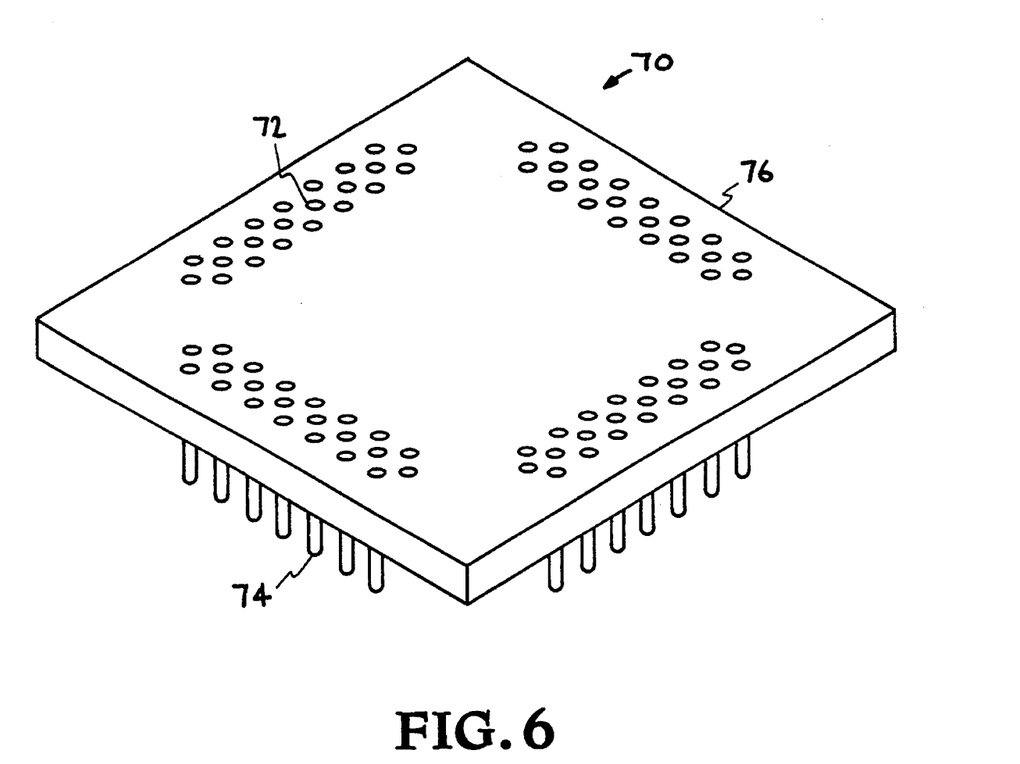
FIG. 6 is an isometric view of an adapter for testing cavity-down QFP devices according to the invention.

FIG. 6 shows an adapter 70 according to the invention which is used in connection with testing of cavity-down QFP devices in the test socket 28 of FIGS. 4A–4B. The adapter 70 includes a number of sockets (typically shown as 72) positioned for receiving the connections pins 42 of FIG. 4B which extend from the bottom surface of a test socket 28 of FIG. 4A–4B. The adapter also includes a corresponding number of outwardly extending pins (typically shown as 74) which connect with sockets of the automatic equipment machine (not shown). The female sockets 72 and the outwardly extending pins 74 are mounted in body member 76 for the adapter 70. The body 76 is formed, for example, as a multi-layer printed circuit board (PCB). The body 76 provides electrical conductors between respective pairs of sockets 72 and pins 74. The electrical conductors are provided in the multilayer PCB using, for example, as conductive traces formed at one or more levels of the multi-layer PCB with connections being made between the various levels and the pins and sockets using plated through holes.

Figure 7:
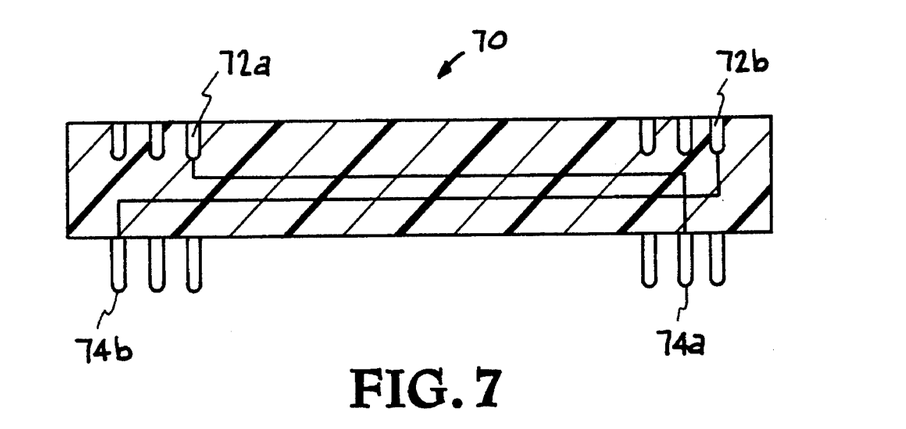
FIG. 7 is a sectional view of an adapter for testing cavity-down QFP devices according to the invention.

FIG. 7 a sectional view of the adapter 70 illustrating typical electrical interconnections between a pair formed of socket 72a and pin 74a and a pair formed of socket 72b and pin 74b. In order to expose the die of a cavity-down QFP package for failure analysis work, the QFP package itself must be turned upside down in the test socket 28 of FIGS. 4A–4B. It should be apparent that, when this happens, pin 1 on the QFP package no longer corresponds to pin 1 on the test socket and to pin 1 on the automatic test equipment so that the connection pattern is "scrambled". The electrical connections in the adapter "de-scramble" these connections to make the connections of the upside-down cavity-down QFP package compatible with the sockets of the automatic test equipment. With the adapter 70, pin 1 of the QFP package will connect with pin 1 on the automatic test equipment The features of the test socket can now be extended to cavity-down QFP devices with the use of the adapter 70. This includes providing a solution for working with dynamic liquid crystal, micro-probing, and e-beam probing techniques on cavity down QFP devices.

Figure 8:
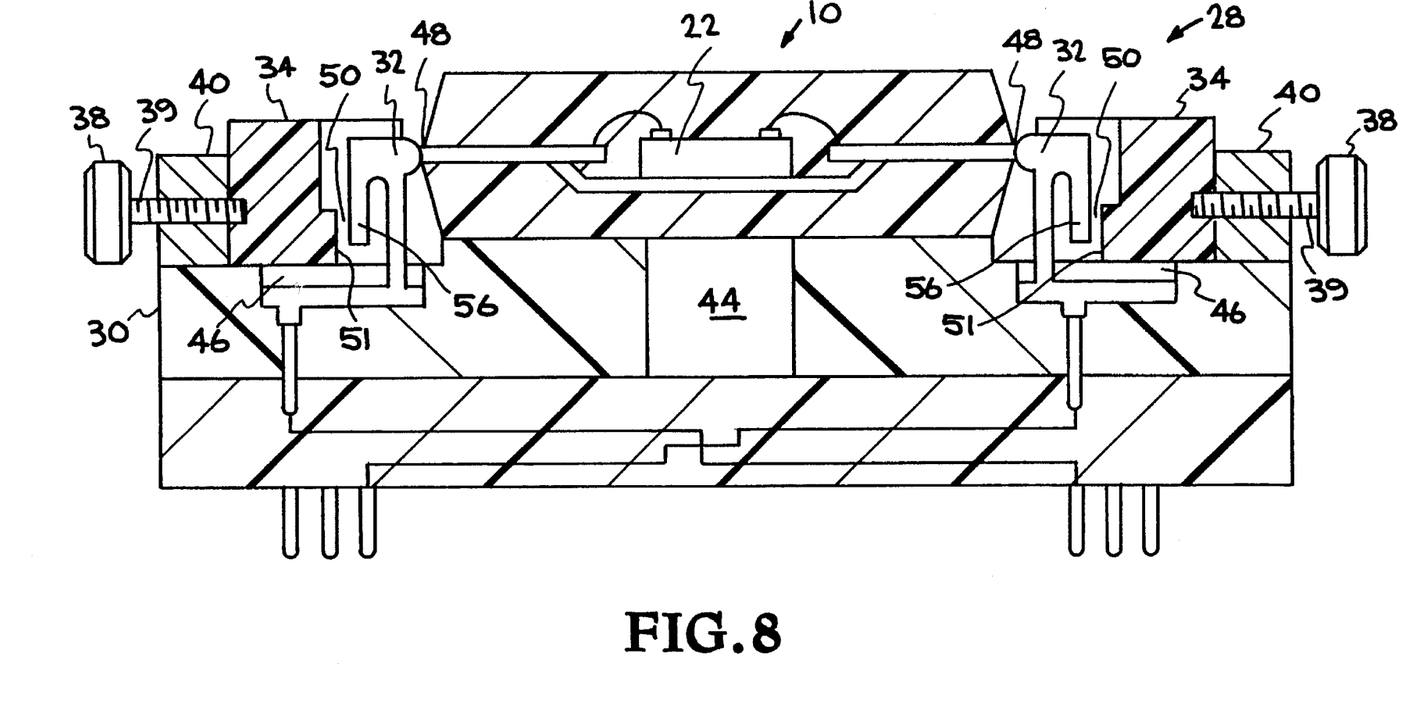
FIG. 8 is a cross-sectional view of a test socket and an adapter according to the invention for analysis of a cavity-down QFP device.

FIG. 8 is a cross-sectional view showing an adapter 70 of FIG. 7 connected to a test socket 28 of FIGS. 4A–4B with a cavity-down QFP package mounted therein. The bottom surface of the package is up to allow the top surface of the die to be exposed for testing and analysis.

The test socket and the adapter according to the invention permit testing and evaluation of QFP devices which have been specially prepared by clipping off all the package leads as close as possible to the package surface. Many of these QFP devices have been rejected at the board or system level at customer's facilities where the devices, prior to being rejected, had been surface-mounted by being soldered onto a mounting surface. The soldered, rejected devices are then mechanically removed from the PC boards and in the process are physically damaged and returned in an untestable condition. These rejected devices are prepared by clipping off their leads and then inserting the devices into a specially designed socket that would allow the devices to be tested. The footprint of the socket would be designed to be compatible with existing socket footprints thereby permitting interchangeability with existing tester hardware. This would permit testing, datalogging, and full failure-analysis capability for devices that are currently not being tested, not being data logged, and receiving very limited Failure Analysis work, if any. Using the adapter according to the invention would allow cavity-down QFP devices to be tested, datalogged, and failure analyzed in the same way that a cavity-up QFP device is done with the test socket.

Using the adapter board to "unscramble" the connections between the tester and the test socket with a cavity-down QFP device, which is mounted upside down in the test socket, allows the socket to be used with a cavity-down device. As was mentioned above, cavity-down or "dead bug" means that the die is mounted upside down in the package. In order to expose the die for failure analysis work, the package itself must be turned upside down. When this happens, the pin 1 on the socket no longer corresponds to pin 1 on the device being tested. All the features of the socket that made it useful originally, can now be extended to cavity down parts with the use of the proposed adapter. This includes providing a solution for working with dynamic liquid crystal, micro-probing, and e-beam probing techniques on cavity-down devices. In one preferred embodiment the adapter is a PCB that would take the pins of the socket with an upside down, cavity-down part in it and "de-scramble" the pins to make it compatible with a rightside up, cavity down devices. With this adapter, cavity-down devices could be used with the socket with no changes to existing testing hardware or software and avoiding additional costly hardware and/or software changes to accommodate cavity-down QFP devices.

A method is provided according to the invention for mounting and for testing a cavity-down QFP integrated-circuit device having a plurality of leads, which are cut off flush to the sidewalls of a QFP package. The method includes the step of placing the cavity-down QFP integrated-circuit device in a test socket with the die of the cavity-down QFP integrated-circuit device in a die-up orientation. The test socket external output pins mounted to the test socket are arranged in a predetermined pattern for making connections between designated pins of a cavity-up QFP integrated-circuit package and correspondingly designated test input sockets of the automatic test equipment. The method also includes the step of contacting the flush cutoff leads of the QFP integrated-circuit device with a respective one of a plurality of resiliently-mounted contact blades extending from said test socket to provide electrical contact with external pins mounted to said test socket. Finally, the method includes the step of unscrambling the connections between the external pins of the test socket and the test input sockets of the automatic test equipment so that a cavity-down QFP mounted upside-down can be tested in the same test socket as a cavity-up QFP device.

The step of unscrambling includes the steps of: designating each of the test input sockets of the automatic test equipment with respective specified pin numbers corresponding to the output pin numbers of a cavity-up QFP package; designating each of the output pins of the cavity-down QFP package with respective specified pin numbers; and providing respective electrical connection between each pair of respective pin numbers.

The step of providing respective electrical connections between each pair of respective pin numbers includes making such electrical connections with an adapter member having a top surface which has fixed thereto a number of adapter sockets for engagement with respective ones of the plurality of test connections pins mounted in the base. The adapter has a bottom surface having a number of adapter test pins extending therefrom and is adapted for engagement with a test socket of the automatic test equipment for integrated-circuits wherein said test sockets are arranged in a predetermined pattern for making connections to a cavity-up QFP integrated-circuit package. The adapter also has connection means for predeterminedly electrically connecting adapter sockets to adapter test pins in an arrangement which provides that the output pins of a cavity-down QFP package makes connections with the test sockets of the automatic test equipment. The test sockets are arranged in a pattern for making connections to a cavity-up QFP integrated-circuit package when a cavity-down QFP package is mounted die-side-up in the test socket to provide access to the die.

The step of providing electrical connections includes using an adapter member formed as a multi-layer printed-circuit board for unscrambling the connections between the external pins of the test socket and the test inputs sockets of the automatic test equipment so that a cavity-down QFP mounted upside-down can be tested in the same test socket as a cavity-up QFP device to provide access to the die.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A test socket assembly, which uses the same test input socket of an automatic test equipment, for mounting and for testing, in both a die-up or a die-down orientation, a cavity-down quad flat pack (QFP) integrated-circuit device having a plurality of leads, which are cut off flush to the sidewalls of said QFP package, said test socket assembly comprising:

a test socket having a base on which is mounted and supported, in both a die-up or a die-down orientation, a cavity-down QFP integrated-circuit package having a die, with the package for the cavity-down QFP integrated-circuit being mounted to the test socket with the die up so that the die of the cavity-down QFP integrated-circuit package is positioned on the test socket to be exposed for probing and analysis, or alternatively, with the package for the cavity-down QFP integrated-circuit being mounted to the test socket with the die down so that the die of the cavity-down QFP integrated-circuit package is positioned on the test socket to be not exposed for probing and analysis;

said test socket having a plurality of resilient contact blades mounted to said base for engagement with a corresponding flush cutoff lead of the QFP package;

said test socket including a plurality of external test connection pins mounted in said base, wherein each of the esternal test connection pins is connected to respective ones of said contact blades when the cavity-down QFP integrated-circuit is mounted with the die up and wherein each of the external test connection pins is connected to other respective ones of said contact blades when the cavity-down QFP integrated-circuit is mounted with the die down;

means for unscrambling the connections between the external test connection pins of the test socket and a group of test input sockets of an automatic test equipment for testing integrated circuits so that a cavity-down QFP mounted mounted with the die down can be tested with the same test socket and test input socket configuration as the cavity-down QFP device mounted the die down.

2. The test socket assembly of claim 1 wherein the means for unscrambling includes an adapter member for making connections between correspondingly numbered pins of the test socket and the pins of the test input sockets of the automatic test equipment.

3. The test socket assembly of claim 2 wherein the adapter member is formed as a multi-layer printed-circuit board.

4. The test socket assembly of claim 3:

wherein the multi-layer printed-circuit board includes a top surface which has fixed thereto a number of adapter sockets for engagement with respective ones of the plurality of external test connections pins mounted in said base of said test socket, wherein said multi-layer printed-circuit board has a bottom surface having a number of adapter test pins extending therefrom and adapted for engagement with respective ones of the group of test input sockets of the automatic test equipment for integrated-circuits, wherein said test input sockets of the automatic test equipment are arranged in a predetermined pattern for making direct connections to each one of a group of a cavity-up QFP integrated-circuit package, wherein said multi-layer printed-circuit board has connection means for predeterminedly electrically connecting respective adapter sockets to adapter test pins in an arrangement which provides that each one of a group of leads of a cavity-down QFP package makes connection with a respective one of the test input sockets of the automatic test equipment to provide access to the die for testing, and wherein said test input sockets of the automatic test equipment are arranged in a pattern for making connections to a cavity-up QFP integrated-circuit package when a cavity-down QFP package is mounted die-side-up in the test socket.

5. A method for mounting and for testing a cavity-down QFP integrated-circuit device having a plurality of leads, which are cut off flush to the sidewalls of said QFP package, which method uses the same test input socket of an automatic test equipment, for mounting and for testing a cavity-down QFP integrated-circuit device, in both a die-up or a die-down orientation, comprising the steps of:

placing a cavity-down QFP integrated-circuit device having a die in a test socket having external output pins mounted thereto, with the die of the cavity-down QFP integrated-circuit device mounted in a die-up orientation so that the die of the cavity-down QFP integrated-circuit package is positioned on the test socket with the die exposed for probing and analysis;

alternatively placing the cavity-down QFP integrated-circuit device in the test socket with the die of the cavity-down QFP integrated-circuit device mounted in a die-down orientation so that the die is positioned on the test socket with the die not exposed for probing and analysis;

contacting the flush cutoff leads of the QFP integrated-circuit device with a respective one of a plurality of resiliently-mounted contact blades extending from said test socket to provide electrical contact with the external output pins mounted to said test socket;

unscrambling the connections between the external pins of the test socket and the test input sockets of the automatic equipment so that a cavity-down QFP mounted with its die up can be tested in the same test socket as a cavity-down QFP device mounted with its die down.

6. The method of claim 5 wherein the step of unscrambling includes the steps of:

designating each of the test input sockets of the automatic test equipment with a respective specified pin number corresponding to an output pin number of the cavity-up QFP package;

designating each of the output pins of a cavity-down QFP package with one of the respective specified pin numbers;

providing respective electrical connection between each pair of respective pin numbers.

7. The method of claim 6 wherein the step of providing respective electrical connections between each pair of respective pin numbers includes making such electrical connections with an adapter member having a top surface which has fixed thereto a number of adapter sockets for engagement with respective ones of the plurality of test connections pins mounted in said base, said adapter having a bottom surface having a number of adapter test pins extending therefrom and adapted for engagement with one of a plurality of test socket of the automatic test equipment for integrated-circuits wherein said test sockets are arranged in a predetermined pattern for making connections to a cavity-up QFP integrated-circuit package, said adapter having connection means for predeterminedly electrically connecting adapter sockets to adapter test pins in an arrangement which provides that an output pin of a cavity-down QFP package makes connection with a corresponding test socket of the automatic test equipment wherein said test sockets are arranged in a pattern for making connections to a cavity-up QFP integrated-circuit package when a cavity-down QFP package is mounted die-side-up in the test socket to provide access to the die.

8. The method of claim 5 wherein the step of providing electrical connections includes using an adapter member formed as a multi-layer printed-circuit board for unscrambling the connections between the external pins of the test socket and the test inputs sockets of the automatic test equipment so that a cavity-down QFP mounted upside-down can be tested in the same socket as a cavity-up QFP device to provide access to the die.

* * * * *